US007131192B2

(12) United States Patent
Stanford

(10) Patent No.: US 7,131,192 B2
(45) Date of Patent: Nov. 7, 2006

(54) METHOD OF MANUFACTURING PRINTED CIRCUIT BOARDS USING MINIATURE CONTACT BLOCK PACKAGINGS

(75) Inventor: Robert Stanford, Flowery Branch, GA (US)

(73) Assignee: Motorola, Inc., Schaumburg, IL (US)

( * ) Notice: Subject to any disclaimer, the term of this patent is extended or adjusted under 35 U.S.C. 154(b) by 240 days.

(21) Appl. No.: 10/861,161

(22) Filed: Jun. 5, 2004

(65) Prior Publication Data
US 2004/0229507 A1 Nov. 18, 2004

Related U.S. Application Data

(62) Division of application No. 10/280,532, filed on Oct. 25, 2002, now abandoned.

(51) Int. Cl.
*H01R 43/00* (2006.01)
(52) U.S. Cl. .................. 29/827; 29/825; 29/874; 29/884; 29/840; 257/696; 257/772; 439/884
(58) Field of Classification Search .............. 29/825, 29/827, 830–835, 846–855; 257/666, 676, 257/692, 669; 439/590, 66; 174/52.1, 255; 228/180.21, 180.22
See application file for complete search history.

(56) References Cited

U.S. PATENT DOCUMENTS

| 5,170,328 | A | | 12/1992 | Kruppa |
| 5,343,072 | A | * | 8/1994 | Imai et al. ................. 257/666 |
| 5,495,669 | A | * | 3/1996 | Legrady et al. ............... 29/885 |
| 6,040,620 | A | * | 3/2000 | Sugimoto et al. .......... 257/666 |

* cited by examiner

*Primary Examiner*—Minh Trinh
(74) *Attorney, Agent, or Firm*—Hisashi D. Watanabe

(57) ABSTRACT

This invention is a method of manufacturing printed circuit boards using a contact block packaging to provide and support electrical contact blocks relative to a printed circuit board panel. The contact block packaging is situated adjacent to the printed circuit board panel, so that electrical contact blocks of the contact block packaging are aligned with circuit boards of the printed circuit board panel, but breakaway stems supporting the electrical contact blocks are offset from webbing of the printed circuit board panel. The electrical contact blocks are then soldered to the printed circuit boards. Thereafter, the breakaway stems of the contact block packaging and the webs of the printed circuit board panel are broken, so that the electronic contact blocks are decoupled from the rest of the contact block packaging and the printed circuit boards are decoupled from the rest of the printed circuit board panel.

2 Claims, 3 Drawing Sheets

METHOD OF MANUFACTURING PRINTED CIRCUIT BOARDS USING MINIATURE CONTACT BLOCK PACKAGINGS

BACKGROUND

1. Technical Field

This invention relates generally to electrical connectors for printed circuit boards, and more specifically to packaging for miniature contact blocks that are to be coupled to high density printed circuit boards.

2. Background Art

Electronic devices are becoming smaller and smaller. It seems not long ago that the use of a portable telephone meant having to carry around a bag the size of a shoebox. By contrast, today's cellular phones are less than 8 cubic inches. They easily fit into a shirt pocket.

The battery packs for these electronic devices have gotten smaller as well. New battery technologies allow battery designers to build batteries less than 2 cubic inches in size that provide hours of talk-time energy to a cellular phone.

To be effective, these new battery technologies require peripheral electronic circuitry. For example, an ordinary lithium based battery needs a safety circuit and an overcurrent device. These components are generally mounted on a very small printed circuit board coupled to the battery.

The problem with the miniaturization of these battery packs lies in the connector. Today's electronic devices often draw large amounts of current. To reliably get the current from the battery to the phone, a robust electrical connector must be used. The connector must be large enough so as to deliver the current to the electronic device without adding too much electrical resistance. Consequently, sometimes the connector is nearly as big as the battery's printed circuit board.

These connectors generally come in one of several well-known packages. These include tape and reel packaging, plastic trays, tubes, bags, embossed tape, radial tape and metal strips. The typical manufacturing process involves either a machine or human picking up a single connector, placing it on the board then soldering the connector to the board.

The problem with this cumbersome manufacturing process is twofold: First, it is slow and costly to place a single part at a time, especially when with human labor. Second, machine placement requires large parts with stable centers of gravity. As the machine places parts into a tacky solder paste, parts that are too small may tip over, thereby causing defective solder connections.

There is thus a need for an improved means of coupling miniature electrical connectors to small printed circuit boards.

DETAILED DESCRIPTION OF THE INVENTION

Figure 1:
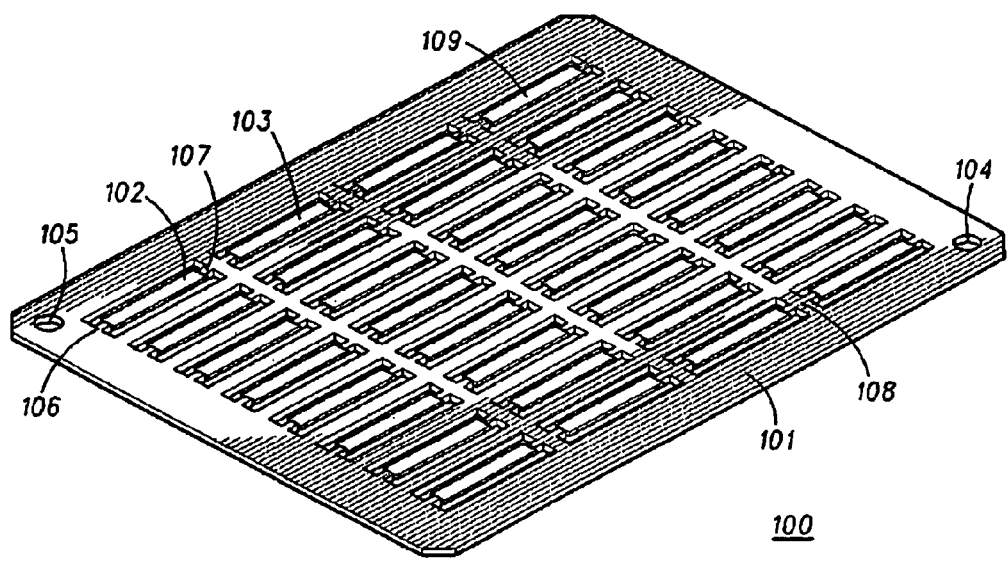
FIG. 1 is an illustration of a prior art printed circuit board panel.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." An exemplary reference designator will be used to refer to any of a plurality of like components.

Referring now to FIG. 1, illustrated therein is a prior art printed circuit board array. The structure is generally referred to as a "panel" 100. It is generally made of fiberglass layers disposed about electrically conductive metal. The panel 100 includes an outer edge 101 with a plurality of circuit boards 102,103 disposed therein. Each circuit board 102,103 includes electrically conductive pads for coupling to electronic components and connectors. The outer edge 101 includes tooling holes 104,105 for aligning the panel 100 into automated equipment.

Each circuit board 102,103 is held in place by webbing. For example, circuit board 102 is coupled into the panel by webs 106 and 107. Web 106 couples to the outer edge 101, while web 107 couples to an inner rib 108.

Figure 2:
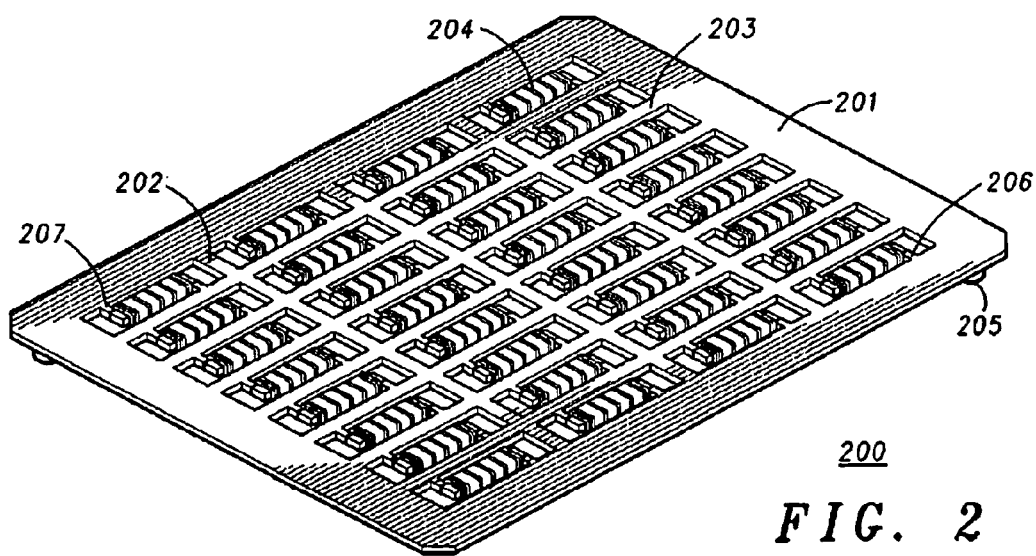
FIG. 2 is a contact block packaging system in accordance with the invention.

Referring now to FIG. 2, illustrated therein is a miniature contact block array 200 in accordance with the invention. The array 200 is preferably manufactured of injection-molded plastic. The array 200 has an outer member, or "rim" 201, that is interlaced with rigid members, or inner "ribs" 202,203.

Disposed between the ribs 202,203 are electrical contact blocks 204. The electrical contact blocks 204 are preferably plastic supports with metal contacts disposed about them. They are preferably manufactured by way of insert molding, wherein the metal contacts are placed into a cavity mold, and molten plastic is injected about the metal contacts. The array optionally includes at least one snap 205 (preferably two, disposed at opposite ends of the array 200). Each contact block 204 is coupled to the ribs 202,203 by break-away stems 206,207.

Figure 3:
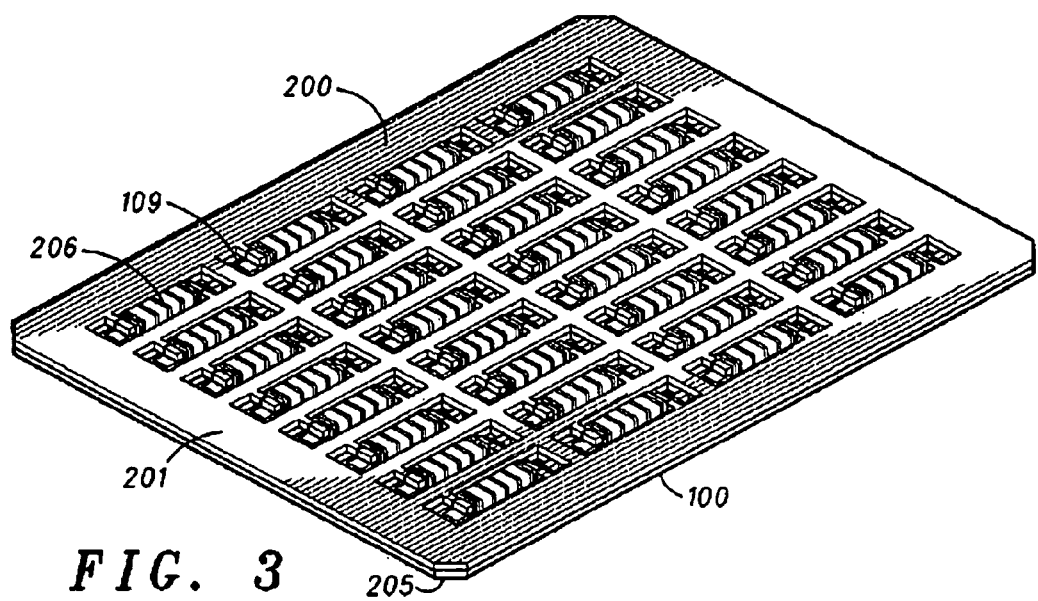
FIG. 3 is a contact block packaging system in accordance with the invention coupled to a prior art printed circuit board panel.

Referring now to FIG. 3, illustrate therein is a miniature contact block array 200 (as shown in FIG. 2) coupled to a printed circuit board 100 (as shown in FIG. 1). The snaps 205 (other not shown) have been inserted into the tooling holes. This insertion accomplishes two functions: First, it aligns the contact blocks 206 with the circuit boards 109. Second, it applies a force in the direction from the array 200 towards the panel to keep the contact blocks 206 from moving relative to the circuit boards 109. The contact block 209 placement within the rim 201 has been designed to match the electrical contacts (for mating to the contact blocks 209) on the circuit boards 109.

Once the array 200 has been coupled to the panel 100, the contact blocks 206 may be permanently coupled to the boards 109 by any number of known manufacturing techniques. These include hand soldering, oven reflow soldering, and wave soldering.

Figure 4:
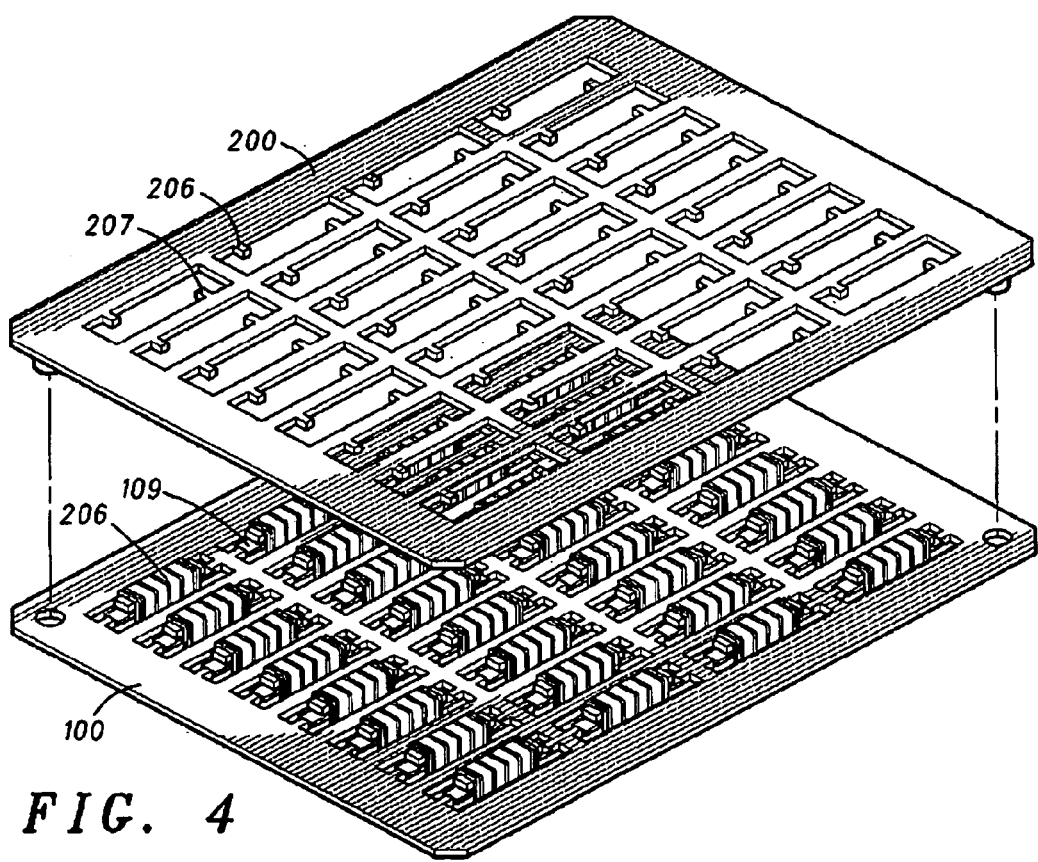
FIG. 4 is a contact block packaging system having the break-away stems broken in accordance with the invention.

Once the contact blocks 206 are permanently coupled to the boards 109, each of the break-away stems are broken away. Referring now to FIG. 4, illustrated therein is the panel 100 and array 200 after the break-away stems 206–207 have been broken away. The breaking away may be accomplished by way of a press-type machine that breaks all the stems simultaneously, or by an operator in the case of delicate electronics. The array 200, without the contact blocks 206, is then removed from the panel 100. Notice that the contact blocks 209 are now affixed to the circuit boards 109 within the panel 100.

Figure 5:
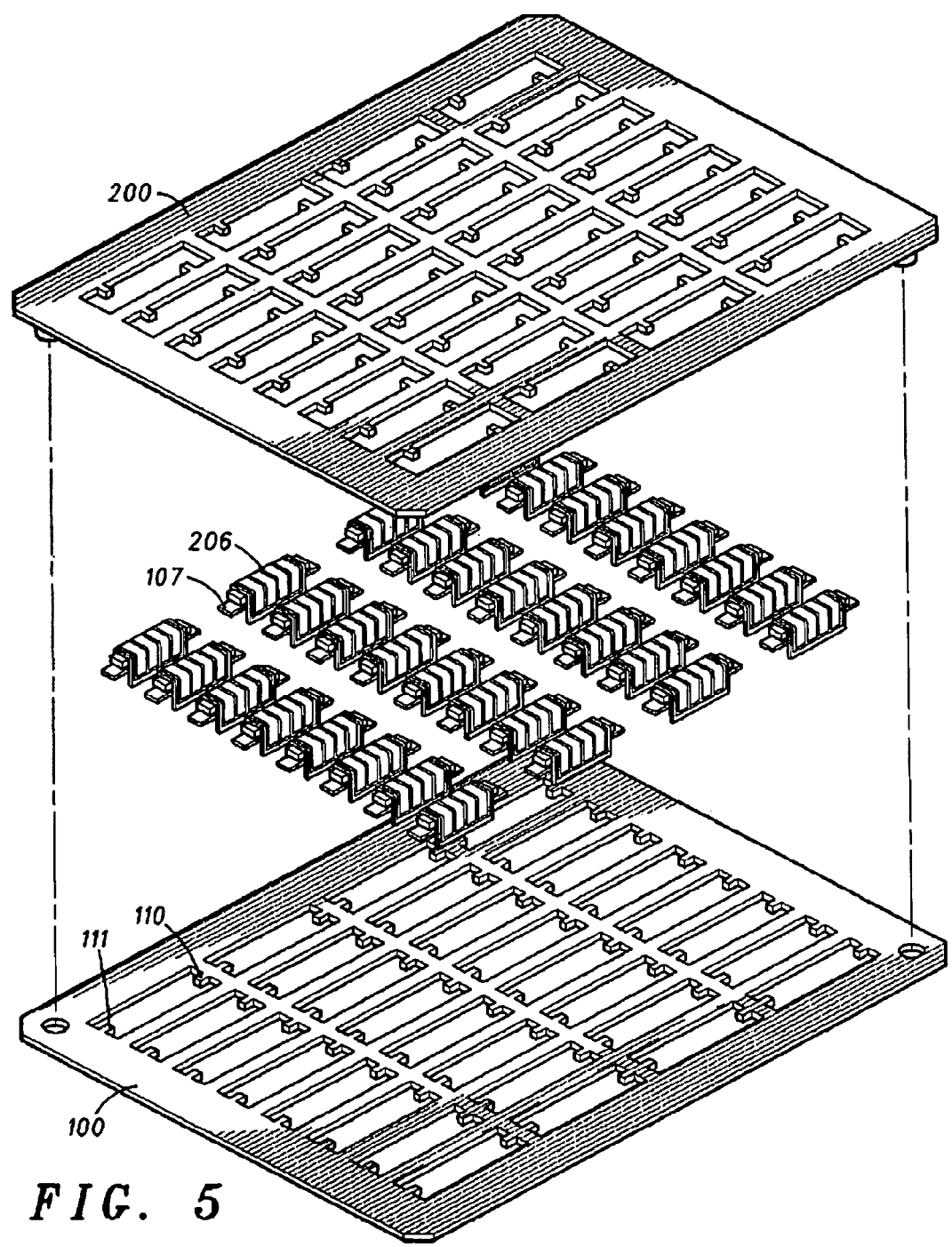
FIG. 5 is an exploded view of a contact block packaging system having the break-away stems broken in accordance with the invention over a printed circuit board panel having the webbing broken.

The circuit boards 109 may now be removed from the panel 100 by traditional means. This generally involves a press-type machine applying a cutting force to the webbing. Referring now to FIG. 5, illustrated therein is an exploded view of the circuit boards 109, with contact blocks 206 permanently affixed, removed from the panel 100. Each web 110,111 has been cut so that the panel may be easily removed.

The present invention offers several advantages over the prior art contact block packaging that required a "one-at-a-time" approach. First, it reduces the cost of manufacture by increasing the efficiency and reducing the number of defective boards. Second, it gives the contact block designer flexibility in that he may now design smaller, more asymmetric contact blocks without worrying about the center of gravity. Third, it allows the contact block manufacturer to mold the packaging right into the contact block as opposed to requiring additional packaging. Fourth, the array prevents the contact blocks from skewing, misaligning or tilting as all connectors are tied to the panel. Fifth, custom nozzles on automatic placement machines are no longer required.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. For example, by designing the break-away tabs atop the panel webbing, both the webbing of the panel and the break-away stems of the array could be broken simultaneously, thereby saving costs.

What is claimed is:

1. A method of manufacturing printed circuit boards using a contact block packaging to provide and support electrical contact blocks relative to a printed circuit board panel, the printed circuit board panel including a plurality of circuit boards coupled to remaining components of the printed circuit board panel by a plurality of webs, the contact block packaging including a plurality of electrical contact blocks coupled to remaining components of the contact block packaging by a plurality of breakaway stems, the method comprising the steps of:

situating the contact block packaging adjacent to the printed circuit board panel, so that the plurality of electrical contact blocks of the contact block packaging are aligned with the plurality of circuit boards of the printed circuit board panel, but the plurality of breakaway stems of the contact block packaging are offset from the plurality of webs of the printed circuit board panel;

soldering the plurality of electrical contact blocks of the contact block packaging to the plurality of printed circuit boards of the printed circuit board panel;

breaking the plurality of breakaway stems of the contact block packaging so that the plurality of electronic contact blocks are decoupled from the remaining components of the contact block packaging; and breaking the plurality of webs of the printed circuit board panel so that the plurality of printed circuit boards are decoupled from the remaining components of the printed circuit board panel.

2. The method of claim 1, wherein the breaking of the plurality of breakaway stems of the electronic contact blocks and the breaking of the plurality of webs of the printed circuit board occur in the same step.

* * * * *